United States Patent
Chilcott

(10) Patent No.: US 7,524,767 B2
(45) Date of Patent: Apr. 28, 2009

(54) METHOD FOR MANUFACTURING A MICRO-ELECTRO-MECHANICAL STRUCTURE

(75) Inventor: Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 389 days.

(21) Appl. No.: 11/239,259

(22) Filed: Sep. 29, 2005

(65) Prior Publication Data

US 2007/0072428 A1  Mar. 29, 2007

(51) Int. Cl.
H01L 21/302 (2006.01)

(52) U.S. Cl. .................. 438/700; 438/706; 438/719; 216/44; 216/99

(58) Field of Classification Search ........... 438/700, 438/706, 710, 719, 720; 216/17, 46, 79, 216/2, 87
See application file for complete search history.

(56) References Cited

U.S. PATENT DOCUMENTS

| | | | |
|---|---|---|---|
| 5,706,565 A | | 1/1998 | Sparks et al. |
| 5,831,162 A | | 11/1998 | Sparks et al. |
| 6,479,334 B1 * | | 11/2002 | Codama et al. ............. 438/161 |
| 6,740,537 B2 | | 5/2004 | Helin |
| 2002/0166838 A1 * | | 11/2002 | Nagarajan ..................... 216/2 |
| 2003/0176006 A1 | | 9/2003 | Oohara et al. |
| 2004/0067346 A1 * | | 4/2004 | Hofmann et al. ......... 428/195.1 |
| 2004/0110383 A1 * | | 6/2004 | Tanaka ........................ 438/700 |

2004/0207074 A1  10/2004  MacDonald et al.

OTHER PUBLICATIONS

"Application of the Footing Effect in the Micromachining of Self-Aligned, Free-Standing, complimentary Metal-Oxide-Semiconductor Compatible Structures," A. A. Ayón, K. Ishihara, R. A. Braff, H. H. Sawin and M. A. Schmidt, *J. Vac. Sci. Technol. A*, vol. 17, No. 4, Jul./Aug. 1999, 6 pages.

"Advanced Plasma Processing Combined with Trench Isolation Technology for Fabrication and Fast Prototyping of High Aspect Ratio MEMS in Standard Silicon Wafers," E. Sarajilć, M.J. de Boer, H. V. Jansen, N. Arnal, M. Puech, G. Krijnen and M. Elwenspoek, *Journal of Micromechanics and Microengineering*, Aug. 20, 2004, pp. S70-S75.

"A Threshold Pressure Switch Utilizing Plastically-Deformed Silicon," Huff, M.A., A.D. Nikolich, and M.A. Schmidt, Microsystems Technology Laboratories, Massachusetts Institute of Technology, Cambridge, MA Jun. 1991, (pp. 177-180).

European Patent Office, "European Search Report," for European Application No. 06076692.0-1528, Aug. 8, 2008 (7 pages).

European Patent Office, "Partial European Search Report," for European Application No. 06076692.0-1528, Jun. 4, 2008 (4 pages).

* cited by examiner

*Primary Examiner*—Lan Vinh
(74) *Attorney, Agent, or Firm*—Jimmy L. Funke

(57) ABSTRACT

A technique for manufacturing a micro-electro-mechanical (MEM) structure includes a number of steps. Initially, a substrate is provided. Next, a plurality of trenches are etched into the substrate with a first etch. Then, a charging layer is formed at a bottom of each of the trenches to form undercut trenches. Finally, a second etch is provided into the undercut trenches. The charging layer causes the second etch to laterally etch foots in the substrate between the undercut trenches. The footers undercut the substrate to release a portion of the substrate for providing a movable structure between the undercut trenches and above the footers.

24 Claims, 3 Drawing Sheets

METHOD FOR MANUFACTURING A MICRO-ELECTRO-MECHANICAL STRUCTURE

TECHNICAL FIELD

The present invention is generally directed to a micro-electro-mechanical (MEM) structure and, more specifically, to a method for manufacturing a MEM structure.

BACKGROUND OF THE INVENTION

Various micro-electro-mechanical (MEM) devices, also known as micro-electro-mechanical systems (MEMS) devices, require the formation of a moving structure, e.g., a silicon structure. These structures have been formed using various techniques, including single crystal silicon and thin film surface micromachining. In general, surface micromachining requires the selective removal of a sacrificial film, to allow the MEM structure to move. In other MEM devices, a deep reactive ion etch (DRIE) has been utilized to form silicon structures, by etching through a silicon layer and stopping on a sacrificial oxide layer that is subsequently removed. In general, this process results in a high-aspect ratio silicon structure with relatively low stress. However, the process requires expensive silicon-on-insulator (SOI) wafers or non-standard thick polysilicon processes.

In some conventional approaches, utilizing a DRIE on an SOI wafer has resulted in an artifact at the oxide-silicon interface, due to charging of the oxide. This artifact (or footer) is generally undesirable. Designers have spent considerable effort to eliminate the footers that result from conventional processes.

What is needed is a technique for manufacturing a micro-electro-mechanical (MEM) structure that eliminates the need for the utilization of silicon-on-insulator (SOI) wafers or thick polysilicon wafers for forming single crystal silicon structures in a MEM device.

SUMMARY OF THE INVENTION

The present invention is generally directed to a technique for manufacturing a micro-electro-mechanical (MEM) structure that includes a number of steps. Initially, a substrate is provided. Next, a plurality of trenches are etched into the substrate with a first etch. Then, a charging layer is formed at a bottom of each of the trenches to form undercut trenches. Finally, a second etch is provided into the undercut trenches. The charging layer causes the second etch to laterally etch footers in the substrate between the undercut trenches. The footers undercut the substrate to release a portion of the substrate for providing a moveable structure between the undercut trenches and above the footers.

According to one aspect of the present invention, the charging layer may be, for example, an oxide layer. According to this aspect of the present invention, the oxide layer may be formed at the bottom of each of the trenches through a directional oxide deposition, e.g., quartz sputtering. According to yet another aspect of present invention, the oxide layer may also be formed at the bottom of each of the trenches through a selective oxidation process. According to another aspect of the present invention, the first and second etches are deep reactive ion etches (DRIE).

According to a different aspect of the present invention, the process may also include the additional steps of etching at least one isolation trench in the substrate and filling the at least one isolation trench with a dielectric to electrically isolate the moveable structure. According to yet another aspect of the present invention, the substrate is made of a silicon. According to a different aspect of the present invention, an edge definition trench is etched into the substrate to define edges of the moveable structure.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to one aspect of the present invention, a charging layer, e.g., an oxide layer, is selectively provided at a bottom of each of a plurality of undercut trenches or holes. A deep reactive ion etch (DRIE) is then performed. During the DRIE etch, the oxide at the bottom of the undercut trenches causes the silicon directly above the oxide to laterally etch until adjacent footers of nearby trenches connect. In this manner, a moveable structure between the undercut trenches (and above the footers) is released. The charging layer may be made from a variety of different semiconductor films, including an oxide. One method for providing an oxide at the bottom of the undercut trenches is to use a directional oxide deposition, e.g., quartz sputtering. Another technique for providing oxide at the bottom of the undercut trenches is to use a planarization film, e.g., spin-on-glass (SOG). It should be appreciated that any directional deposition method and/or selective oxidation method may be utilized, according to the present invention.

The present invention provides a MEM device that is also compatible with complementary metal-oxide semiconductor (COMS) processing, which allows the formation of integrated sensors, using single crystal silicon moving structures. Electrical isolation of the moving structures can be achieved with trenches filled with a dielectric or other known isolating techniques that are utilized, for example, with silicon-on insulator (SOI) wafers.

Figure 1:
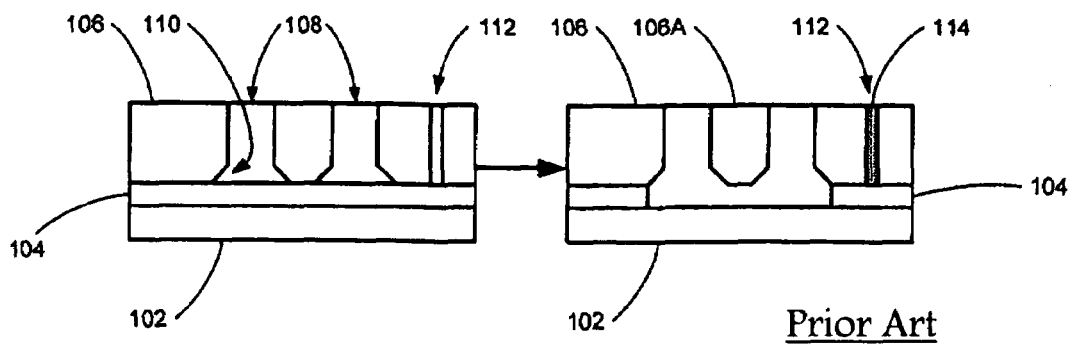
FIG. 1 is a cross-sectional view of relevant portions of a micro-electro-mechanical (NEM) device, made from a silicon-on-insulator (SOI) wafer, during processing according to the prior art.

FIG. 1 depicts cross-sectional views of relevant portions of an SOI wafer during relevant prior art processing steps. As is shown in FIG. 1, a handle wafer 102 is bonded to an active wafer 106 with a bonding layer 104, e.g., an oxide layer. As is shown, a DRIE has been utilized to form trenches 108 through the active wafer 106. As is shown, the trenches 108 exhibit undercutting 110, i.e., footers, that are a result of ion deflection from the bonding (or charging) layer 104. A portion of the layer 104 that is exposed by the DRIE is then removed freeing moveable structure 106A, which is isolated from circuitry formed on a non-moveable portion of the wafer 106, via an isolation trench 112 filled with a dielectric 114. As previously noted, the footer 110 formation is due to charge-induced ion deflection at the oxide layer.

Figure 2:
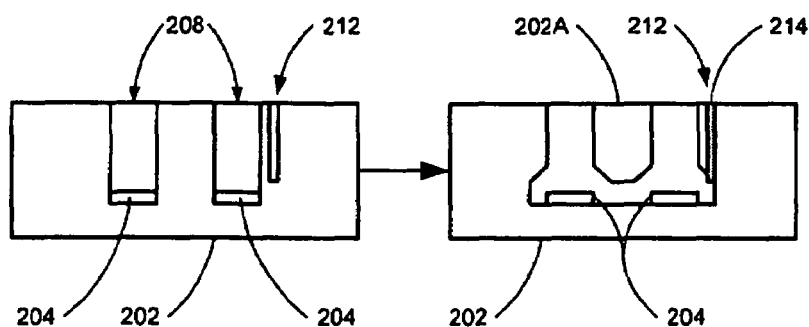
FIG. 2 is a cross-sectional view of a MEM device, made from a single substrate, during processing according to the present invention.

With reference to FIG. 2, relevant portions of a micro-electro-mechanical (MEM) structure are depicted during processing according to the present invention. As is shown in FIG. 2, a substrate 202 has had formed therein a plurality of undercut trenches 208. Deposited at the bottom of the undercut trenches 208 is a charging layer 204, e.g., an oxide layer. A moveable structure 202A is released by performing a deep reactive ion etch (DRIE), which is a result of the oxide layer 204 creating footers, to combine nearby trenches. As is shown in FIG. 2, an isolation trench 212 is filled with a dielectric 214, to provide electrical isolation for the moveable structure 202A. As noted above, the lateral undercutting occurs during the DRIE when the impinging ions are deflected by charge on the layer 204.

Figure 3:
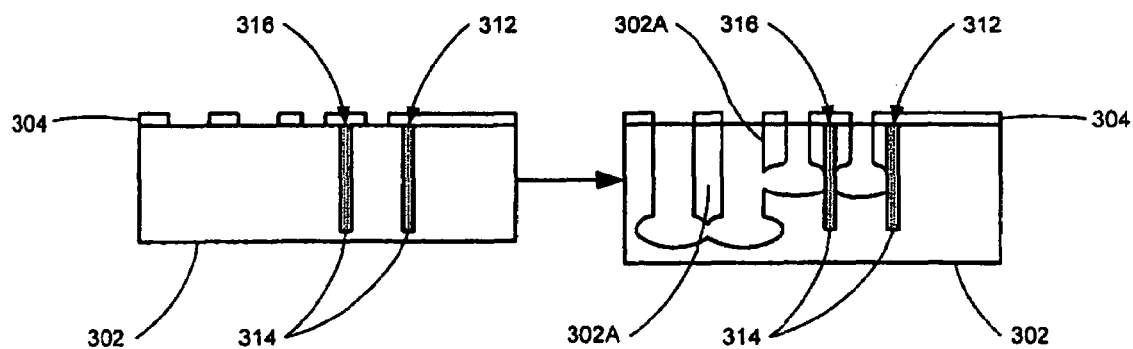
FIG. 3 is a cross-sectional view of another MEM device, made from a single substrate, during processing according to the present invention.

With reference to FIG. 3, relevant portions of another MEM structure are depicted during processing according to the present invention. As is shown, a substrate 302 includes an etch mask layer 304 that provides a mask for a DRIE. An anchor trench 316 is filled with a dielectric 314, to provide an isolated anchor post. Similarly, an isolation trench 312 is filled with the dielectric 314 to isolate a moveable structure 302A to be formed. The undercut formed by lateral etching isolates structure 302A by removing silicon to etch up to isolation trench 312 and anchor trench 316. As is depicted, the moveable structure 302A is undercut and released from the substrate 302 by the DRIE.

Figure 4:
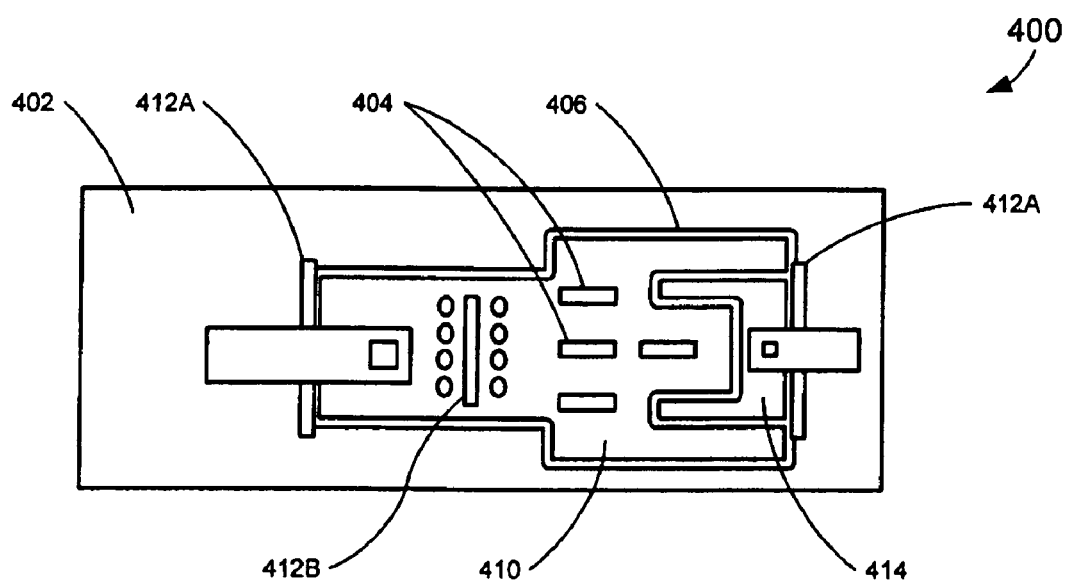
FIG. 4 is a top view of another MEM device, made from a single substrate using a process according to the present invention, detailing the various components of the MEM device.

With reference to FIG. 4, a top view of an exemplary embodiment of a MEM sensor 400 manufactured according to the present invention is depicted. As is shown in FIG. 4, the sensor 400 includes a substrate 402, which has formed therein a plurality of undercut trenches 404 and a definition trench 406. The definition trench 406 defines edges of a moveable structure 410. Dielectric filled isolation trenches 412A and 412B electrically isolate the moveable structure 410. Isolation trench 412B acts as an anchor to structure 410. As is discussed, in conjunction with FIG. 3, the undercut trenches 404 allow for the freeing of the moveable structure 410 during the DRIE. A fixed sensing area 414 works in conjunction with the moveable structure 410 to provide a capacitive sensor.

It should be appreciated that a wide variety of MEM devices may be manufactured according to the present invention. In general, capacitive MEM devices must be isolated from the substrate of the sensor. One option is to cantilever the moveable structure off the isolation trenches. Another option is to use vertical anchors in isolation trenches. In order to keep from undercutting the isolation regions 312 and 316 as seen in FIG. 3, it is desirable for the isolation regions to be deeper than the undercut trenches. Alternatively, or in addition, small holes may be utilized, which cause the DRIE to etch more shallow around the anchor regions of the device.

It should also be appreciated that the charging layer deposited at the bottom of each of the undercut trenches may take a number of forms. As the reason for the creation of the footing is the ion redirection, due to bias, ion redirection may also be achieved by biasing a doped region in the silicon. For example, a clamp ring bias may be utilized in a DRIE process to achieve ion deflection. An alternative way to achieve ion deflection would be to bias the back of the wafer using a doped region and another type on top of the wafer to be initially trenched before footing occurs. Bias may also be turned on and off to change the direction of the etch during the etching process.

Figure 5:
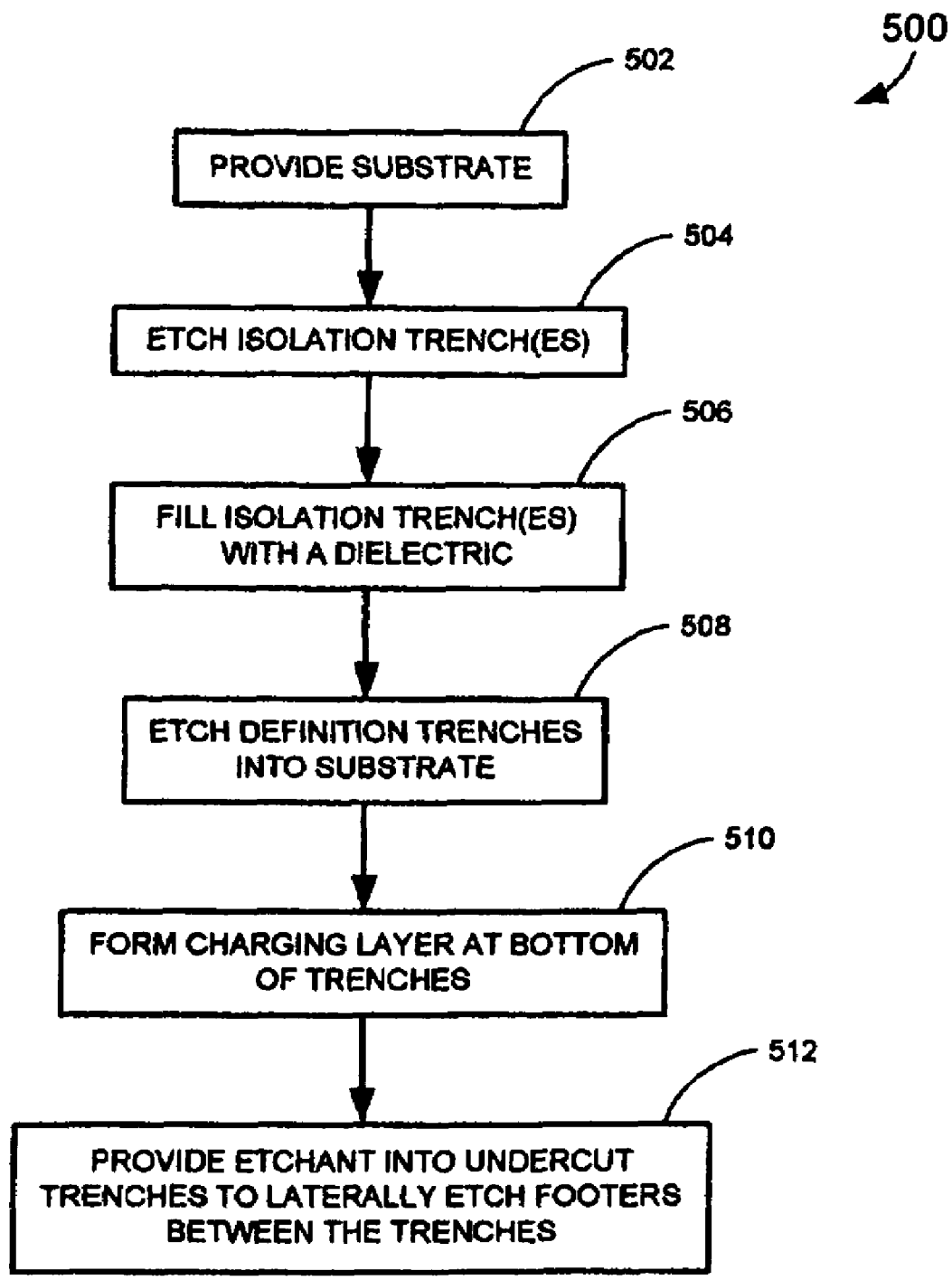
FIG. 5 is a flowchart of a process for manufacturing a MEM structure, according to one embodiment of the present invention.

With reference to FIG. 5, a flowchart for MEM structure manufacturing process 500, according to one embodiment of the present invention, is depicted. In step 502, a substrate, e.g., a silicon wafer, is provided. Next, in step 504, isolation trenches are etched in the substrate. Then, in step 506, the isolation trenches are filled with a dielectric. Next, in step 508, trenches are etched into the substrate. By utilizing etch features of differing cross section areas, differing multiple etch depths can be formed. Shallower trenches can easily be formed next to isolation trenches, and deeper trenches can be formed elsewhere.

According to one embodiment, in step 510, a charging layer, e.g., an oxide layer, is formed at the bottom of the trenches to form undercut trenches. As previously discussed, the charging layer deflects ions during the DRIE and causes footers to be created above the oxide layer into the silicon, thus, undercutting the silicon to the point that the undercut trenches are connected. Finally, in step 512, a DRIE etchant is provided into the trenches to laterally etch the footers between the trenches.

Accordingly, a process has been described herein for manufacturing a micro-electro-mechanical (MEM) structure that eliminates the need for the utilization of silicon-on-insulation (SOI) wafers or thick polysilicon wafers for forming single crystal silicon structures in a MEM device.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for manufacturing a micro-electro-mechanical (MEM) structure, comprising the steps of:
    providing a substrate;
    etching a plurality of trenches into the substrate with a first etch;
    forming a charging layer at a bottom of each of the trenches, wherein the charging layer substantially covers the bottom of the trenches; and
    providing a second etch into the trenches to form undercut trenches, wherein the charging layer causes the second etch to laterally etch footers in the substrate between the undercut trenches, and wherein the footers undercut the substrate to release a portion of the substrate for providing a movable structure between the undercut trenches and above the footers.

2. The method of claim 1, wherein the charging layer is an oxide layer.

3. The method of claim 2, wherein the oxide layer is formed at the bottom of each of the trenches through a directional oxide deposition.

4. The method of claim 3, wherein the directional oxide deposition is a quartz sputtering deposition.

5. The method of claim 2, wherein the oxide layer is formed at the bottom of each of the trenches through a selective oxidation process.

6. The method of claim 1, wherein the first and second etches are deep reactive ion etches (DRIE).

7. The method of claim 1 further comprising the steps of:
etching at least one isolation trench in the substrate; and
filling the at least one isolation trench with a dielectric, wherein the at least one isolation trench electrically isolates the movable structure.

8. The method of claim 1, wherein the substrate is made of silicon.

9. A method for manufacturing a micro-electro-mechanical (MEM) structure, comprising the steps of:
providing a substrate;
forming a dielectric isolation trench;
etching a plurality of undercut trenches into the substrate with a first etch, wherein the undercut trenches comprise a first height trench and a second height trench;
forming a charging layer at a bottom of each of a plurality of trenches, wherein the charging layer substantially covers the bottom of the trenches;
providing a second etch into the trenches, wherein the charging layer causes the second etch to laterally etch footers in the substrate between the trenches to form the undercut trenches; and
providing a movable structure between the undercut trenches.

10. The method of claim 9, wherein the first height trench is shallower than the isolation trench.

11. The method of claim 9, wherein the step of etching comprises forming the first height trench having a first size opening and forming the second height trench having a second size opening.

12. The method of claim 9, wherein the footers undercut the substrate to release a portion of the substrate for providing a movable structure between the undercut trenches and above the footers.

13. The method of claim 9, wherein the charging layer is an oxide layer.

14. The method of claim 13, wherein the oxide layer is formed at the bottom of each of the trenches through a directional oxide deposition.

15. The method of claim 14, wherein the directional oxide deposition is a quartz sputtering deposition.

16. The method of claim 13, wherein the oxide layer is formed at the bottom of each of the trenches through a selective oxidation process.

17. The method of claim 9 further comprising the steps of:
etching at least one isolation trench in the substrate; and
filling the at least one isolation trench with a dielectric, wherein the at least one isolation trench electrically isolates the movable structure.

18. The method of claim 9, wherein the substrate is made of silicon.

19. A method for manufacturing a micro-electro-mechanical (MEM) structure, comprising the steps of:
providing a substrate;
etching a plurality of trenches into the substrate with a first etch;
forming a charging layer at a bottom of each of the trenches, wherein the charging layer substantially covers the bottom of the trenches;
providing a second etch into the trenches to form undercut trenches, wherein the charging layer causes the second etch to laterally etch footers in the substrate between the undercut trenches, and wherein the footers undercut the substrate to release a portion of the substrate for providing a movable structure between the undercut trenches and above the footers;
etching at least one isolation trench in the substrate; and
filling the at least one isolation trench with a dielectric, wherein the at least one isolation trench electrically isolates the movable structure.

20. The method of claim 19, wherein the charging layer is an oxide layer.

21. The method of claim 20, wherein the oxide layer is formed at the bottom of each of the trenches through a directional oxide deposition.

22. The method of claim 21, wherein the directional oxide deposition is a quartz sputtering deposition.

23. The method of claim 20, wherein the oxide layer is formed at the bottom of each of the trenches through a selective oxidation process, and wherein the first and second etches are deep reactive ion etches (DRIE), where the substrate is made of silicon.

24. The method of claim 19 further comprising the step of:
etching an edge definition trench into the substrate to define edges of the movable structure.

* * * * *